United States Patent
Tanaka (10) Patent No.: US 12,354,853 B2
(45) Date of Patent: Jul. 8, 2025

(54) ETCHING METHOD AND PLASMA ETCHING APPARATUS

(71) Applicant: Tokyo Electron Limited, Tokyo (JP)

(72) Inventor: Koki Tanaka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 258 days.

(21) Appl. No.: 17/822,239

(22) Filed: Aug. 25, 2022

(65) Prior Publication Data

US 2023/0069553 A1   Mar. 2, 2023

(30) Foreign Application Priority Data

Aug. 27, 2021   (JP) .................................. 2021-138974

(51) Int. Cl.
*H01L 21/3065* (2006.01)
*H01J 37/32* (2006.01)

(52) U.S. Cl.
CPC . *H01J 37/32724* (2013.01); *H01J 2237/3343* (2013.01)

(58) Field of Classification Search
None
See application file for complete search history.

(56) References Cited

U.S. PATENT DOCUMENTS

| | | | | |
|---|---|---|---|---|
| 2012/0285481 A1* | 11/2012 | Lee | ...................... | C23C 16/0245 134/1.1 |
| 2018/0308695 A1* | 10/2018 | LaVoie | ................ | H01L 21/0338 |
| 2020/0194272 A1* | 6/2020 | Jain | .................... | H01L 21/31116 |
| 2021/0035796 A1* | 2/2021 | Qin | ...................... | H01L 21/0271 |
| 2021/0134596 A1* | 5/2021 | Terashima | ........ | H01L 21/31144 |
| 2021/0233774 A1* | 7/2021 | Kato | ...................... | C09K 13/00 |
| 2022/0051902 A1* | 2/2022 | Tanaka | .............. | H01J 37/32724 |

FOREIGN PATENT DOCUMENTS

| | | |
|---|---|---|
| JP | 2001-135617 | 5/2001 |
| JP | 2016-122774 | 7/2016 |

* cited by examiner

*Primary Examiner* — Shamim Ahmed
(74) *Attorney, Agent, or Firm* — IPUSA, PLLC (57) ABSTRACT

An etching method includes (a) providing a substrate including a carbon-containing film, the substrate being situated on a substrate support and (b) etching the substrate with a plasma to form an etching shape in the carbon-containing film, the plasma being configured to be formed from a gas containing H and O, the etching shape including a bottom. In (b), a temperature of the substrate support is adjusted to 0° C. or less.

9 Claims, 9 Drawing Sheets

)
ETCHING METHOD AND PLASMA ETCHING APPARATUS

CROSS-REFERENCE TO RELATED APPLICATION

This application claims priority to Japanese Patent Application No. 2021-138974, filed Aug. 27, 2021, the entire contents of which are incorporated herein by reference.

TECHNICAL FIELD

The present disclosure relates to an etching method and a plasma etching apparatus.

BACKGROUND

Patent Document 1 describes a technique of performing plasma etching in order to form a recessed portion having a high aspect ratio with respect to a silicon oxide film that is an etching target film. In this technique, the silicon oxide film is etched by generating plasma of a processing gas containing a fluorine-containing gas such as a fluorocarbon gas or a hydrofluorocarbon gas, and a hydrogen gas. In a high aspect structure such as a contact hole of a memory device, an aspect ratio is increased as etching advances, and thus a supplied amount of the etchant is decreased.

RELATED-ART DOCUMENTS

Patent Documents

Patent Document 1: Japanese Unexamined Patent Application Publication No. 2016-122774

SUMMARY

According to an aspect of the present disclosure, an etching method includes (a) providing a substrate including a carbon-containing film, the substrate being situated on a substrate support and (b) etching the substrate with a plasma to form an etching shape in the carbon-containing film, the plasma being configured to be formed from a gas containing H and O, the etching shape including a bottom. In (b), the temperature of the substrate support is adjusted to 0° C. or less.

DETAILED DESCRIPTION

In one embodiment, a method of etching a carbon-containing film is provided. The method includes (a) providing a substrate having a carbon-containing film on a substrate support and (b) etching the substrate with plasma generated from a gas containing H and O to form an etching shape having a bottom in the carbon-containing film, wherein in (b), a temperature of the substrate support is adjusted to 0° C. or less. According to this embodiment, an etchant is efficiently supplied to the bottom of the etching shape, so that an etching rate can be increased.

In one embodiment, the method may include (c) selectively forming a condensed layer or solidified layer of $H_2O$ at the bottom of the etching shape, by plasma generated from a gas containing H and O.

In one embodiment, (b) and (c) may be carried out simultaneously.

In one embodiment, (c) may be performed when an opening diameter of the etching shape is 200 nm or less and an aspect ratio is 3 or more.

Ions in the plasma may be attracted to the bottom, and the condensed layer or solidified layer formed at the bottom may be made to react with the bottom to progress the etching.

In one embodiment, after (a), the temperature of the substrate support may be set to −30° C. or less.

In one embodiment, (d) supplying bias power to the substrate support and etching the bottom with the generated plasma may be included, and in (b) to (d), the temperature of the substrate support may be adjusted to 0° C. or less.

In one embodiment, ions in the plasma may be attracted to the bottom, and a condensed layer of a liquid-phase or a solidified layer of a solid-phase formed at the bottom may be made to react with the bottom to advance the etching.

The bias voltage may be pulsed. The bias voltage may be a negative direct-current bias.

In one embodiment, a plasma etching apparatus includes a chamber; a substrate support that is provided inside the chamber and configured to support a substrate; a plasma generator configured to generate plasma inside the chamber; and a controller. The controller of the apparatus causes (a) providing of a substrate having a carbon-containing film on the substrate support; (b) etching of the substrate with plasma generated from a gas containing H and O to form an etching shape having a bottom in the carbon-containing film, wherein in (b), a temperature of the substrate support is adjusted to 0° C. or less.

Hereinafter, embodiments for implementing the present disclosure will be described with reference to the drawings. In the drawings, the same components will be denoted by the same reference numerals, and overlapping descriptions thereof may be appropriately omitted.

Plasma Processing System

Figure 1:
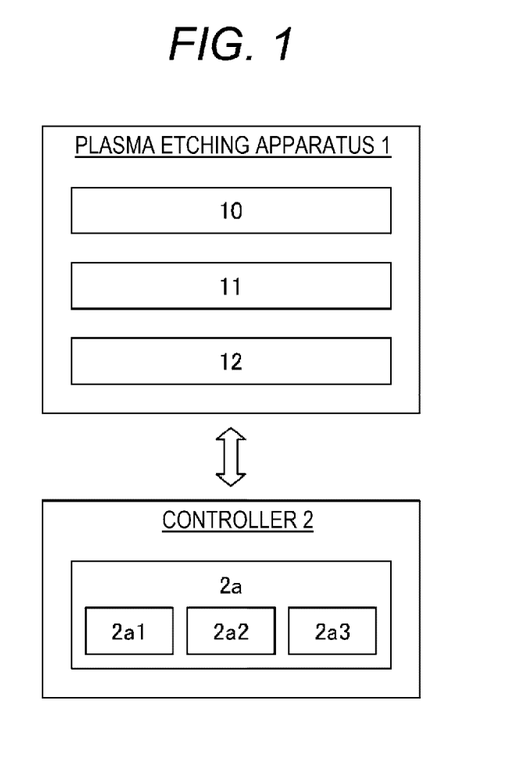
FIG. 1 is a diagram illustrating an example of a plasma processing system according to one embodiment.

In one embodiment, the plasma processing system illustrated in FIG. 1 includes a plasma etching apparatus 1 and a controller 2. The plasma etching apparatus 1 includes a plasma processing chamber 10 (hereinafter, also referred to as a chamber 10), a substrate support 11, and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance (ECR) plasma, helicon wave plasma (HWP), surface wave plasma (SWP), or the like. Further, various types of plasma generators may be used, including an alternating current (AC) plasma generator and a direct current (DC) plasma generator. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 200 kHz to 150 MHz.

The controller 2 processes computer-executable instructions for causing the plasma etching apparatus 1 to execute various steps described herein below in the present disclosure. The controller 2 may be configured to control each component of the plasma etching apparatus 1 so as to execute the various steps described herein below. In an embodiment, part or all of the controller 2 may be included in the plasma etching apparatus 1. The controller 2 may include, for example, a computer 2a. The computer 2a may include, for example, a processor (central processing unit (CPU)) 2a1, a storage unit 2a2, and a communication interface 2a3. The processor 2a1 may be configured to perform various control operations based on a program and a recipe stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma etching apparatus 1 through a communication line such as a local area network (LAN).

Next, an example configuration of a capacitively-coupled plasma etching apparatus 1 as an example of the plasma etching apparatus 1 will be described with reference to FIG. 2. A plasma etching apparatus 1 includes a plasma processing chamber 10, a gas supply 20, a power source 30, and an exhaust system 40. Further, the plasma etching apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The sidewall 10a is grounded. The shower head 13 and the substrate support 11 are electrically insulated from the housing of the plasma processing chamber 10.

The substrate support 11 includes a main body 111 and a ring assembly 112. The main body 111 has a central region (substrate support surface) 111a that supports the substrate (wafer) W, and an annular region (ring support surface) 111b that supports the ring assembly 112. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. In one embodiment, the main body 111 includes a base and an electrostatic chuck, and holds the substrate W by an electrostatic force. The base includes a conductive member. The conductive member of the base functions as a lower electrode. The electrostatic chuck is disposed on the base. The upper surface of the electrostatic chuck has a substrate support surface 111a. The ring assembly 112 includes one or more annular members. At least one of the one or more annular members is an edge ring. Although not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A flow path 18 is formed in the substrate support 11. A heat transfer fluid, such as brine or gas, flows through the flow path 18. Further, the substrate support 11 may include a heat transfer gas supply configured to supply a heat transfer gas between the rear surface of the substrate W and the substrate support surface 111a. For example, the heat transfer gas is supplied between the rear surface of the substrate W and the substrate support surface 111a from the heat transfer gas pipe 19 penetrating the substrate support 11.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation device that modulates or pulses the flow rate of at least one processing gas.

The power source 30 includes an RF power source 31 coupled to plasma processing chamber 10 via at least one impedance matching circuit. The RF power source 31 is configured to supply at least one RF signal (RF power), such as a source RF signal and a bias RF signal, to the conductive member of the substrate support 11 and/or the conductive member of the shower head 13. As a result, plasma is formed from at least one processing gas supplied into the plasma processing space 10s. Accordingly, the RF power source 31 may function as at least a part of the plasma generator 12. Further, supplying of the bias RF signal to the conductive member of the substrate support 11 can generate a bias potential in the substrate W to draw an ion component in the formed plasma to the substrate W.

In one embodiment, the RF power source 31 includes a first RF generator 31a and a second RF generator 31b. The first RF generator 31a is configured to be coupled to the conductive member of the substrate support 11 and/or the conductive member of the shower head 13 via at least one impedance matching circuit to generate the source RF signal (HF power) for plasma generation. The HF power is a plasma generation radio-frequency power that mainly contributes to the generation of plasma. In one embodiment, the source RF signal has a frequency in the range of 13 MHz to 150 MHz. In one embodiment, the first RF generator 31a may be configured to generate a plurality of source RF signals having different frequencies. The generated one or a plurality of source RF signals are supplied to the conductive member of the substrate support 11 and/or the conductive member of the shower head 13. The second RF generator 31b is configured to be coupled to the conductive member of the substrate support 11 via at least one impedance matching circuit to generate the bias RF signal (LF power and bias power). The LF power is a bias radio-frequency power that mainly contributes to the attraction of ions into a substrate W. In one embodiment, the bias RF signal has a lower frequency than the source RF signal. In one embodiment, the bias RF signal has a frequency in the range of 200 kHz to 13.56 MHz. In one embodiment, the second RF generator 31b may be configured to generate a plurality of bias RF signals having different frequencies. The generated one or more bias RF signals are supplied to the conductive member of the substrate support 11. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is connected to the conductive member of the substrate support 11 and configured to generate a first DC signal. The generated first DC signal is applied to the conductive member of the substrate support 11. In one embodiment, the first DC signal may be applied to another electrode, such as an electrode in an electrostatic chuck. In one embodiment, the second DC generator 32b is configured to be connected to the conductive member of the shower head 13 and to generate a second DC signal. The generated second DC signal is applied to the conductive member of the shower head 13. In various embodiments, the first and second DC signals may be pulsed. The pulsed first and second DC signals may be negative direct-current biases. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

Here, the substrate W which is a processing target is a wafer having a diameter of 300 mm. The temperature of the substrate W may be controlled by measuring the temperature of the front surface of the substrate W with a temperature sensor attached to the front surface of the substrate W via an adhesive such as silicone gel. The surface temperature may be calculated by a temperature difference between several portions of the substrate support 11, or the substrate temperature may be measured by an optical method. Further, in the descriptions herein, a mixed gas refers to a gas in which two or more types of gases are mixed (etching gas).

First Embodiment

Etching Method

In the first embodiment, a method MT1 of etching the substrate will be described with reference to FIG. 3. Hereinafter, a case where the method MT1 is applied to the substrate W using the plasma etching apparatus 1 will be described as an example. The method MT1 includes steps S1 to S11.

Figure 2:
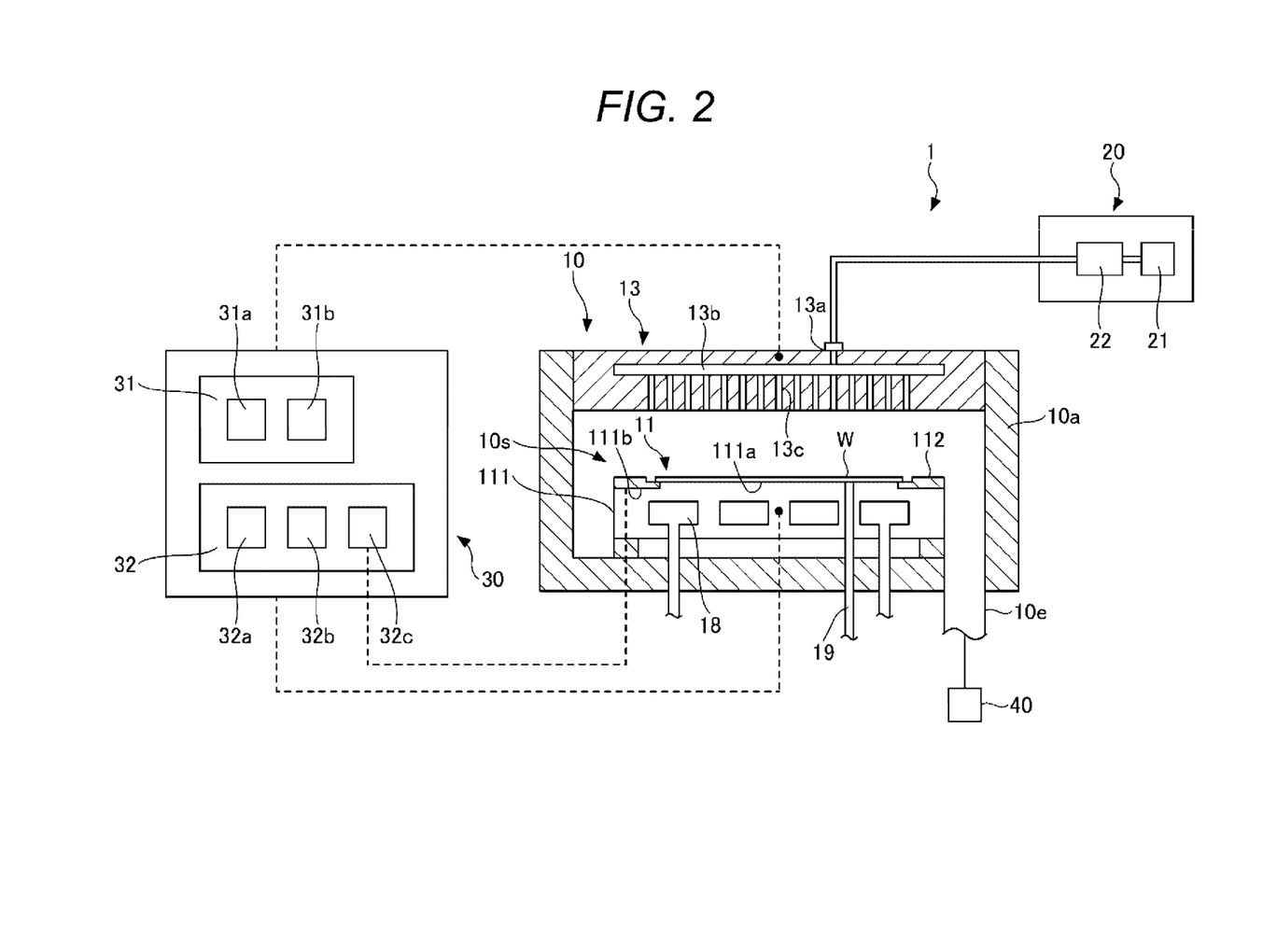
FIG. 2 is a schematic sectional view illustrating an example of a plasma etching apparatus according to one embodiment.

In step S1, the substrate W that includes the carbon-containing film is supported by the substrate support 11 inside the chamber 10 as illustrated in FIG. 2. The carbon-containing film functions as a mask for an etching target film to be an underlayer film thereof.

Figure 9A:
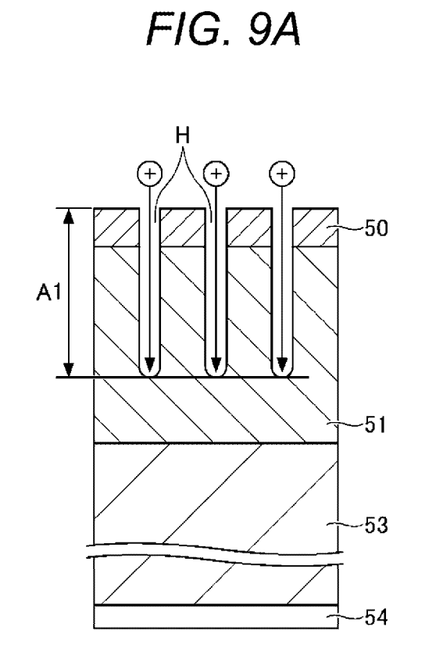
FIGS. 9A to 9C are diagrams for explaining a flow of etching of an etching target film.

For example, as illustrated in FIG. 9A, a silicon-containing film is used as an underlayer film 53 on the substrate 54, and the carbon-containing film 51 thereon is etched. The carbon-containing film 51 is etched into a pattern of openings of the film 50 on the carbon-containing film 51, and therefore an etching shape (recessed portion) of the hole H or the like is formed in the carbon-containing film 51. The film 50 may be a silicon-containing film or a metal-containing film.

The carbon-containing film 51 may be a carbon film, an amorphous carbon film, or a spin on carbon (SOC). The underlayer film 53 may be a silicon-containing film such as a silicon oxide film ($SiO_2$), and may contain two or more types of silicon-containing films. The two or more types of silicon-containing films may include a stacked film of a silicon oxide film and a polysilicon film, or a stacked film of a silicon oxide film and a silicon nitride film. In the present embodiment, for example, in a memory device such as a 3D-NAND, the etching of the silicon-containing film having an aspect ratio of 3 or more is performed. At this time, the carbon-containing film 51 is used as a mask material, and the etching method MT1 of the present embodiment is effective for the etching of the carbon-containing film 51.

Figure 3:
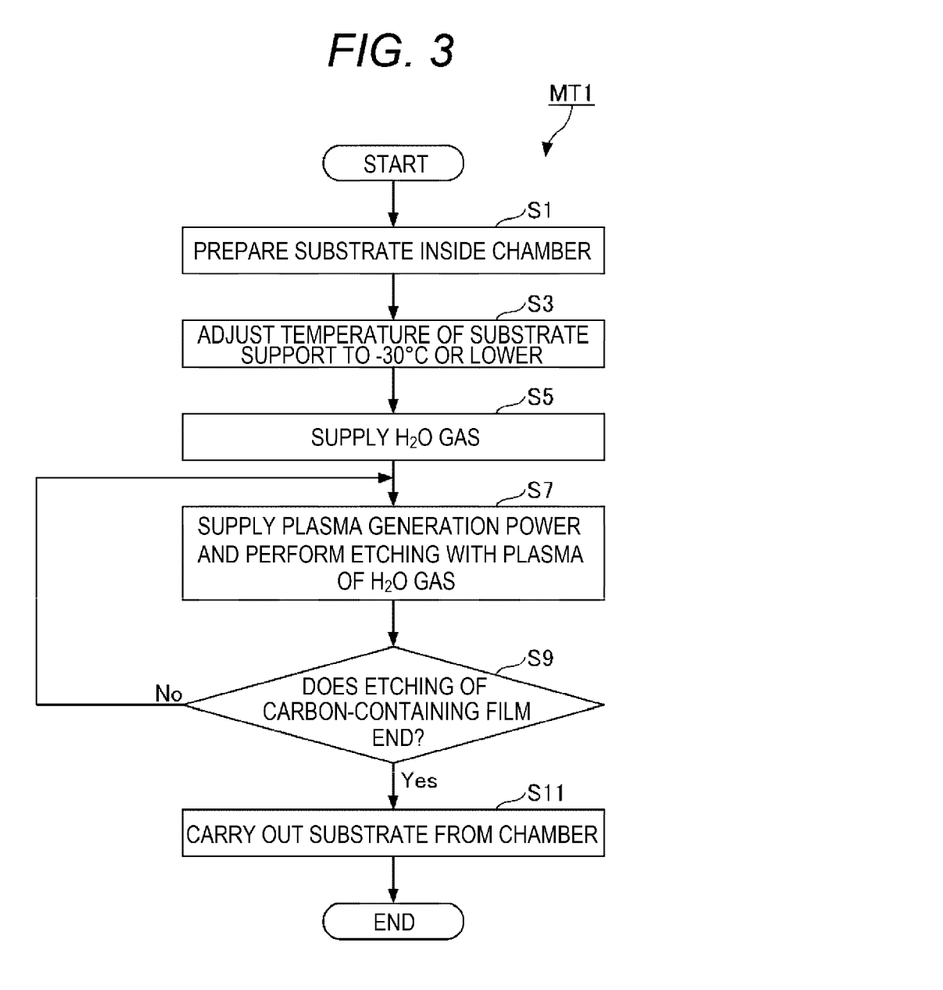
FIG. 3 is a flowchart illustrating an etching method according to a first embodiment.

In FIG. 3, then in step S3, the temperature of the substrate support 11 is set to, for example, −30° C. or less before the start of the etching (temperature of the substrate before the etching start is substantially the same as the temperature of the substrate support 11 before the etching starts). The temperature of the substrate support may be, for example, 0° C. or less. When the temperature of the substrate support is controlled to a low temperature, for example, −30° C. or less, the supply of an etchant to the bottom of the etching shape is accelerated so that the etching rate can be improved. For controlling the temperature of the substrate support, the substrate support 11 may be cooled by using a cooler, or the substrate support 11 may be cooled by flowing a coolant such as liquid nitrogen or chlorofluorocarbons through the substrate support 11. In this way, the temperature of the substrate may be adjusted. In consideration of the heat input by the plasma, the temperature of the coolant flowing through the substrate support 11 in the middle of the etching is set to a temperature of 10° C. or higher and 50° C. or less than a target temperature of the substrate. As an example, a coolant of −100° C. or higher and −10° C. or less is supplied to the flow path 18 inside the substrate support 11. The target temperature of the substrate may be preset to a temperature of 0° C. or less. Further, a heat transfer gas may be supplied from a heat transfer gas pipe 19 penetrating the substrate support 11 to a space between the electrostatic chuck 5 and the rear surface of the substrate W held thereon. Controlling the pressure of the heat transfer gas supplied to the space between the electrostatic chuck 5 and the rear surface of the substrate W allows to control the heat conduction, and therefore the temperature of the substrate can be adjusted. An inert gas may be used as the heat transfer gas. As an example, a rare gas, for example, helium gas may be used.

Next, in step S5, an $H_2O$ gas in which $H_2O$ is gasified as the etching gas is supplied from the gas supply 20 into the plasma processing chamber 10. However, the etching gas is not limited to the $H_2O$, and may be a gas containing H and O. The gas containing H and O may be a gas of an $H_2O_2$, or may be a mixed gas of an H2 gas and an $O_2$ gas. The etching gas may be two or more types of mixed gases containing $H_2O$ and/or $H_2O_2$.

In step S7, the substrate W is etched. In step S7, for example, the carbon-containing film 51 is etched with plasma of the $H_2O$ gas by supplying a high-frequency power for plasma generation of 27 MHz to 100 MHz from the first RF generator 31a to the shower head 13 (upper electrode). The high-frequency power for plasma generation may be supplied from the first RF generator 31a to the substrate support 11 (lower electrode). As the mixed gas, the two or more types of gases may be individually supplied to and mixed in the chamber 10, or may be mixed before being supplied to the chamber 10. As an example, the frequency of the high-frequency supplied from the first RF generator 31a may be 0.1 kW to 5 kW. In the present disclosure, the $H_2O$ gas is supplied, and the carbon-containing film 51 is etched with the plasma of the $H_2O$ gas.

The etching step of the carbon-containing film 51 in step S7 includes the following two steps. These two steps (first step and second step to be described next) may be carried out at the same time or separately. There is nothing that only one of the two steps is carried out. In the first step, the condensed layer or solidified layer of $H_2O$ is selectively formed at the bottom of the etching shape formed in the carbon-containing film 51. The condensed layer or solidified layer is formed such that $H_2O$ which functions as the etchant is preferentially physically adsorbed to the bottom of the etching shape. The physical adsorption of the $H_2O$ occurs in a case where the substrate support is set to a low temperature (for example, 0° C. or less). The adsorption of the $H_2O$ to the bottom forms the condensed layer or solidified layer of the $H_2O$.

As a method of adjusting the substrate support to a low temperature (for example, 0° C. or less), for example, the following are specified: in the middle of the etching, controlling the pressure of the heat transfer gas to be supplied between the substrate W and the electrostatic chuck 5; and/or controlling the magnitude of the bias power. In this way, it is possible to selectively form a condensed layer of a liquid-phase or a solidified layer of a solid-phase at the bottom in the etching shape by adjusting the flow rate of the $H_2O$ gas.

In the second step, a bias power of 200 kHz to 13.56 MHz is supplied from the second RF generator 31b to the substrate support 11, so that the etching is accelerated by the plasma of the $H_2O$ gas. The magnitude of the bias power may be 500 W or more. The bias power is not limited to the radio-frequency power, and may be a voltage pulse such as a DC pulse. The ions in the plasma are attracted to the bottom of the etching shape by the bias power, and the condensed layer or solidified layer formed at the bottom is made to react with the bottom to advance the etching. In this way, the etching shape having the bottom is formed in the carbon-containing film.

The step of etching the substrate with plasma generated from the $H_2O$ gas to form the etching shape having a bottom on the carbon-containing film 51, and the step of selectively forming the condensed layer or solidified layer of $H_2O$ at the bottom of the etching shape with the plasma generated from the $H_2O$ gas may be performed at the same time.

During the etching, the temperature of the substrate rises due to the heat input from the plasma. However, in the present disclosure, after the substrate W is provided on the substrate support 11, the temperature of the substrate support is adjusted to 0° C. or less in the step of etching the substrate with plasma generated from the $H_2O$ gas, and the step of causing the condensed layer or solidified layer formed at the bottom of the etching shape to react with the bottom.

Next, in step S9, it is determined whether the etching of the carbon-containing film 51 is completed. The etching of step S7 is performed until it is determined in step S9 that the etching of the carbon-containing film 51 is completed. If it is determined in step S9 that the etching of the carbon-containing film 51 is completed, the substrate W is carried out from the plasma processing chamber 10 in step S11, and the present processing is ended.

Adsorption of $H_2O$

Figure 4:
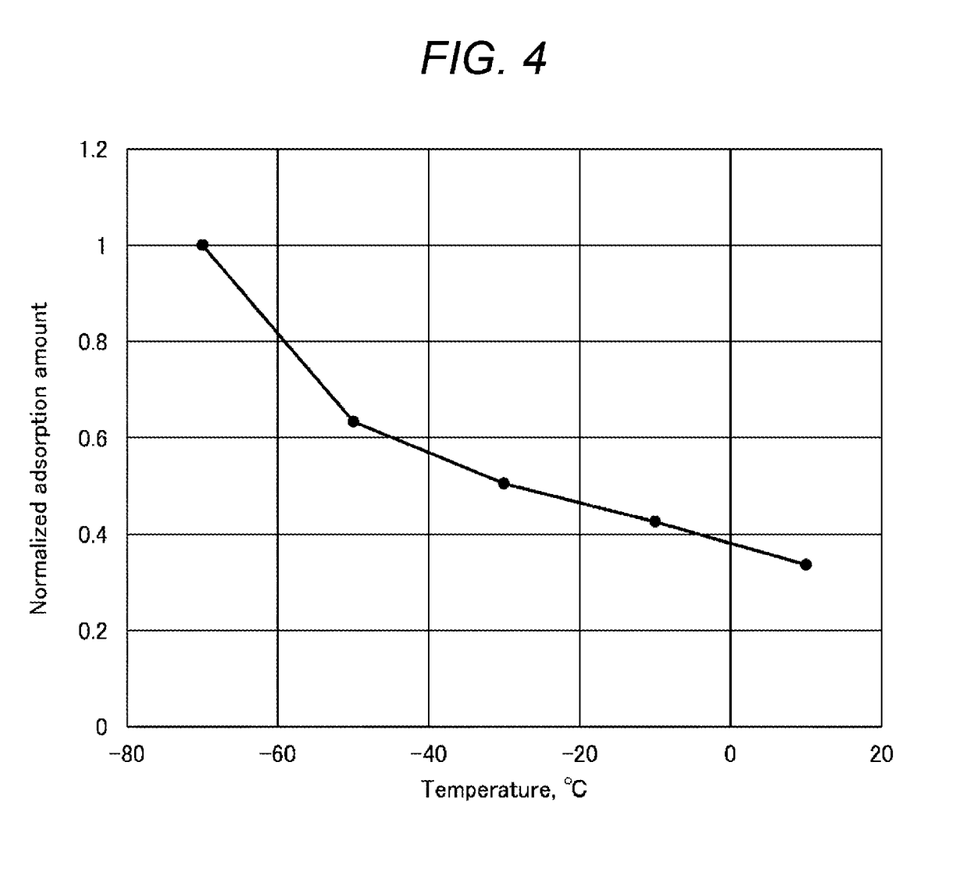
FIG. 4 is a graph illustrating the relation between the temperature of a substrate support by the $H_2O$ gas and adsorption of $H_2O$.

The temperature of the substrate support and the adsorption of $H_2O$ to the bottom of the etching shape caused by the supply of the $H_2O$ gas will be described with reference to FIG. 4. FIG. 4 a graph illustrating a relation between the temperature of the substrate support by the $H_2O$ gas and adsorption of $H_2O$. In FIG. 4, a horizontal axis represents the temperature of the substrate support, and a vertical axis represents the adsorption amount of $H_2O$ on the surface of the substrate. The adsorption amount of $H_2O$ is calculated from the exhaust amount of $H_2O$ measured by using a quadrupolar mass spectrometer (QMS).

Figure 5:
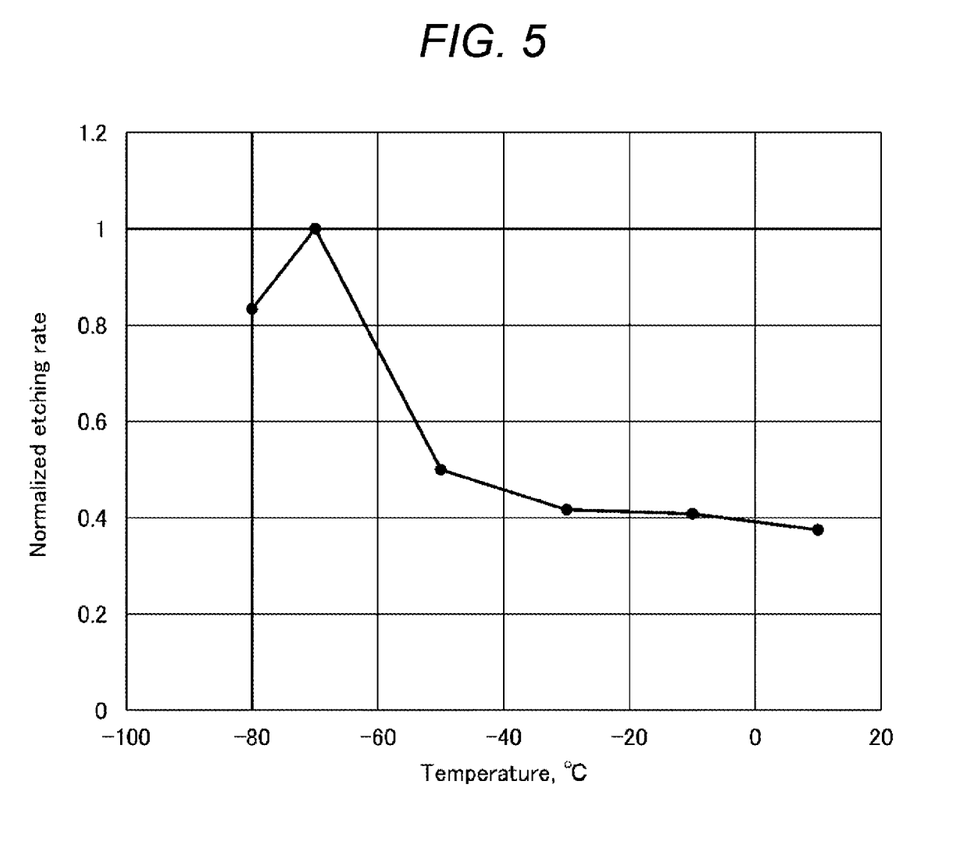
FIG. 5 is a graph illustrating the relation between the temperature of the substrate support by the $H_2O$ gas and an etching rate.

In FIG. 5, the horizontal axis represents the temperature of the substrate support, and the vertical axis represents the etching rate. The etching rate on the vertical axis is normalized with the etching rate of 1 when the temperature of the substrate support is −70° C.

As a result, as illustrated in FIGS. 4 and 5, when the temperature of the substrate support was 0° C. or less, the more the temperature of the substrate support was lowered, the more the $H_2O$ gas was adsorbed on the substrate, and the etching rate remarkably increased at −30° C. or less. From the above, the following is considered: at a temperature of 0° C. or less in the substrate support, the $H_2O$ is adsorbed to the bottom of the etching shape formed in the carbon-containing film, so that the condensed layer or solidified layer of the $H_2O$ is formed. The increase in the etching rate due to the adsorption of the $H_2O$ is remarkable when the temperature of the substrate support is −30° C. or less. However, the temperature of the substrate support may be 0° C. or less, and need not be the etching start temperature. This indicates: as the amount of $H_2O$ adsorbed to the bottom of the etching shape of the carbon-containing film increases, the amount of etchants increases, so that the etching rate increases. That is, the following is considered: the condensed layer or solidified layer of the $H_2O$ formed at the bottom of the etching shape is made to react with the bottom, and the etching progresses mainly due to oxygen atoms in the $H_2O$, and generated by-products at that time such as CO are volatilized.

There is a correlation between the increase in the adsorption amount of $H_2O$ to the bottom of the etching shape and the etching rate of the carbon-containing film, and when the adsorption amount of $H_2O$ increases, the etching rate of the carbon-containing film increases. However, when the adsorption amount of $H_2O$ to the bottom of the etching shape of the carbon-containing film excessively increases, the surface of the etching shape of the carbon-containing film is completely covered with the $H_2O$, and the ions in the plasma do not reach the carbon-containing film, so that the etching rate decreases. Therefore, as illustrated in FIG. 5, the temperature of the substrate support is preferably −80° C. or higher, at which the surface of the etching shape is not completely covered with $H_2O$.

Figure 6:
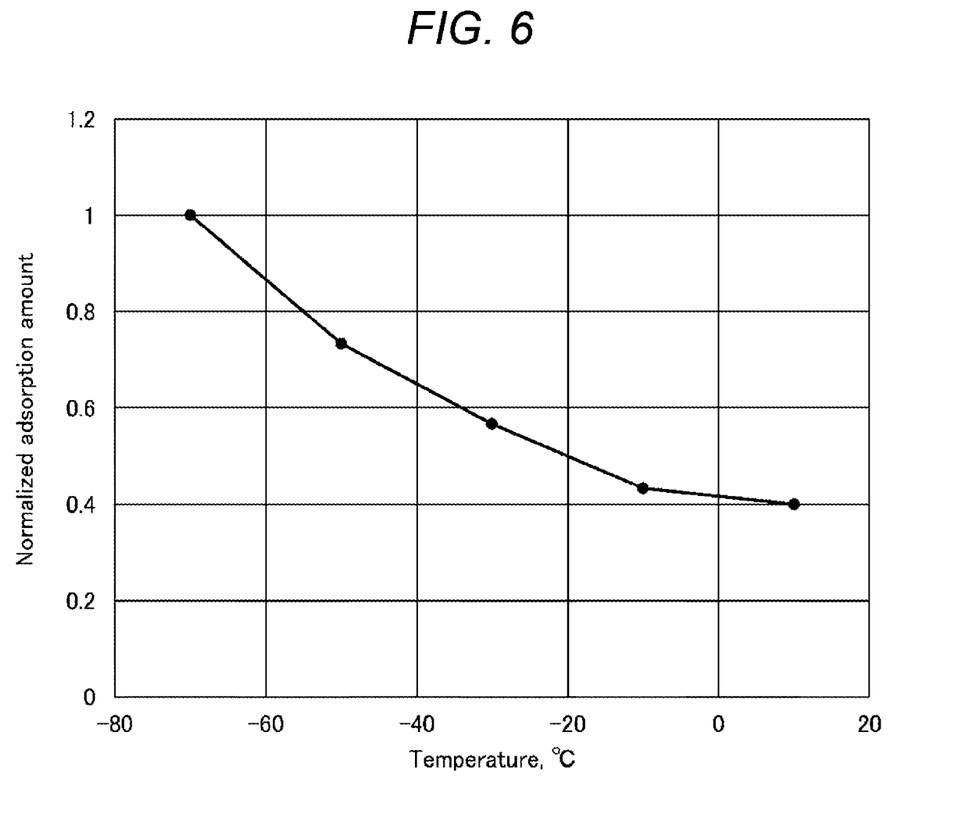
FIG. 6 is a graph illustrating the relation between the temperature of the substrate support by the $O_2$ gas and adsorption of $H_2O$.
Figure 7:
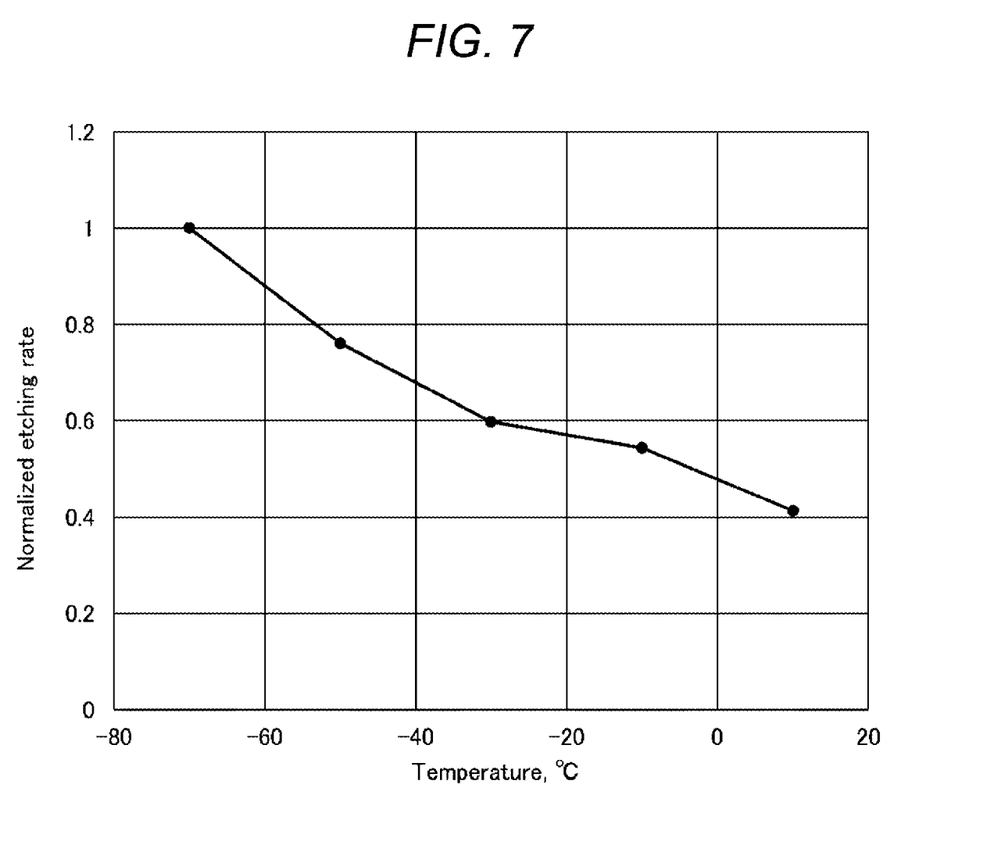
FIG. 7 is a graph illustrating the relation between the temperatures of the substrate support by the $O_2$ gas and the etching rates.

When the carbon-containing film contains H, an $O_2$ gas may be supplied instead of the $H_2O$ gas. The temperature of the substrate support and the adsorption of $H_2O$ to the bottom in this case will be described with reference to FIGS. 6 and 7. In FIG. 6, a horizontal axis represents the temperature of the substrate support, and a vertical axis represents the adsorption amount of $H_2O$ on the surface of the substrate. The adsorption amount of $H_2O$ is calculated from the exhaust amount of $H_2O$ measured by the quadrupolar mass spectrometer. In FIG. 7, a horizontal axis represents the temperature of the substrate support, and a vertical axis represents the etching rate. The etching rate on the vertical axis is normalized with the etching rate of 1 when the temperature of the substrate support is −70° C.

As a result, as illustrated in FIGS. 6 and 7, in a case where the temperature of the substrate support was 0° C. or less, the more the temperature of the substrate support was lowered, the more the $H_2O$ gas was adsorbed on the substrate, and the etching rate remarkably increased at −30° C. or less. From the above, the following is considered: at a temperature of 0° C. or less in the substrate support, the plasma of the $O_2$ gas reacts with the H in the carbon-containing film, the $H_2O$ is adsorbed to the bottom of the etching shape formed in the carbon-containing film, so that the condensed layer or solidified layer of the $H_2O$ is formed. The increase in the etching rate due to the adsorption of the $H_2O$ is remarkable when the temperature of the substrate support is −30° C. or less. However, the temperature of the substrate support may be 0° C. or less, and need not be the etching start temperature.

In the etching method according to the first embodiment and the second embodiment which is described later, the carbon-containing film may be etched while the temperature of the substrate (or the substrate support) is raised. For example, the temperature of the substrate support may be set to −70° C. to start the etching, and the etching may be performed while the temperature of the substrate support is raised in the middle of the etching. In this case, the temperature of the substrate support may be raised in the middle of the etching of the carbon-containing film, or the temperature may be raised after the etching. Even in this case, the temperature of the substrate support is adjusted to 0° C. or less during the etching.

During the etching, the temperature of the substrate increases due to the heat input from the plasma, the temperature of the substrate is controlled by adjusting the pressure of the heat transfer gas supplied between the rear surface of the substrate and the front surface of the substrate support, and the temperature of the substrate support is adjusted to 0° C. or less even in the middle of the etching. That is, the temperature of the substrate support is adjusted to 0° C. or less during the step of supplying the etching gas containing hydrogen fluoride gas into the chamber 10, and the step of supplying the high-frequency power for plasma generation and etching the substrate W with the plasma generated from the etching gas.

Second Embodiment

Etching Method

Figure 8:
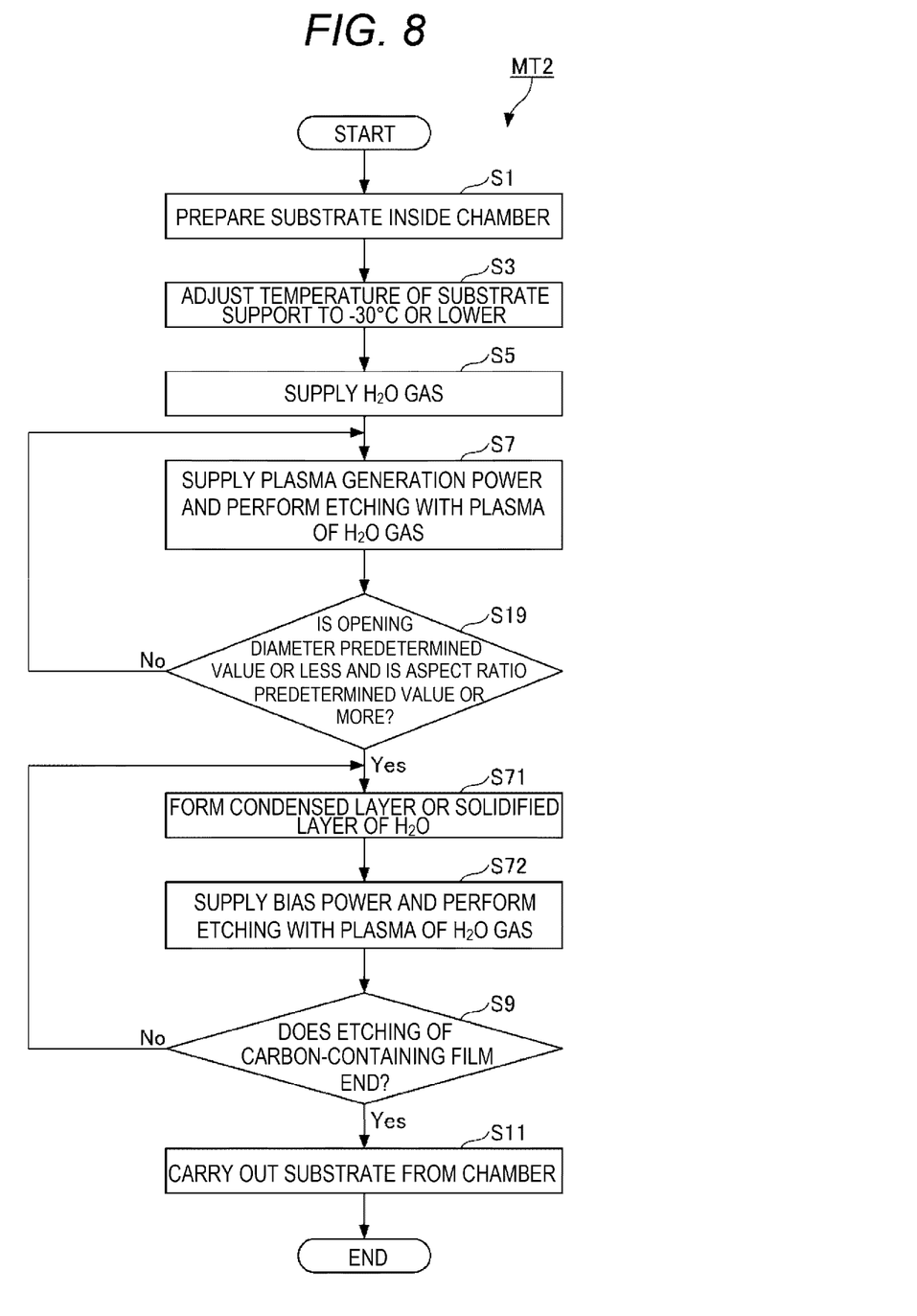
FIG. 8 is a flowchart illustrating an etching method according to a second embodiment.

In the second embodiment, an etching method MT2 of the substrate will be described with reference to FIGS. 8 to 9C. FIG. 8 is a flowchart illustrating an etching method according to a second embodiment. FIGS. 9A to 9C are drawings for explaining a flow of etching of an etching target film.

Hereinafter, a case where the method MT2 is applied to the substrate W using the plasma etching apparatus 1 will be described as an example. In the method MT2, the same steps as those in the method MT1 are denoted by the same reference numerals, and descriptions thereof will be omitted. The method MT2 includes the same steps S1 to S11 as those of the method MT1, and further executes steps S19, S71, and S72 between step S7 and step S9.

In the method MT2, steps S1 to S7 are executed as in the method MT1, and then, in step S19, after the etching shape reaches a predetermined opening diameter or less and a predetermined aspect ratio or more, in one example, the etching shape reaches the opening diameter of 200 nm or less and the aspect ratio of 3 or more, it is possible to selectively form the condensed layer of the liquid-phase or the solidified layer of the solid-phase in which $H_2O$ is condensed at the bottom of the etching shape by adjusting the flow rate of the $H_2O$ gas. The condensed layer or solidified layer is formed such that $H_2O$ which functions as the etchant is preferentially physically adsorbed to the bottom of the etching shape. According to the method MT2, the etching rate may be maintained or improved by the condensed or solidified layer, even after the etching is progressed to a depth where the aspect ratio is a predetermined value or more, for example, 3 or more.

FIG. 9A illustrates the etching of a hole H with an etching depth A1 where the aspect ratio is less than a predetermined value, for example, the aspect ratio is less than 3 (etching of step S7). The hole H is an example of the etching shape formed in the carbon-containing film 51, and the etching shape may be a line pattern.

Figure 9B:
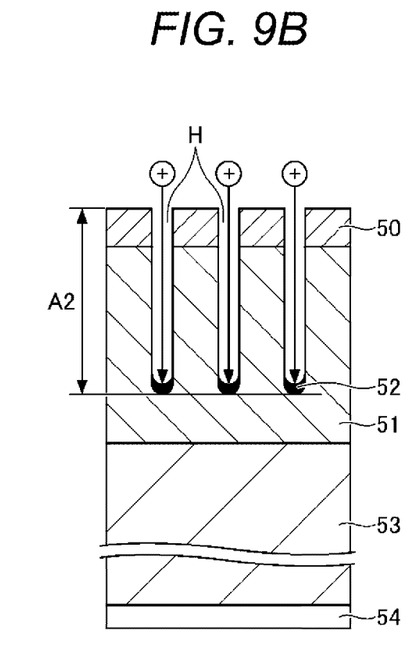
Figure 9C:
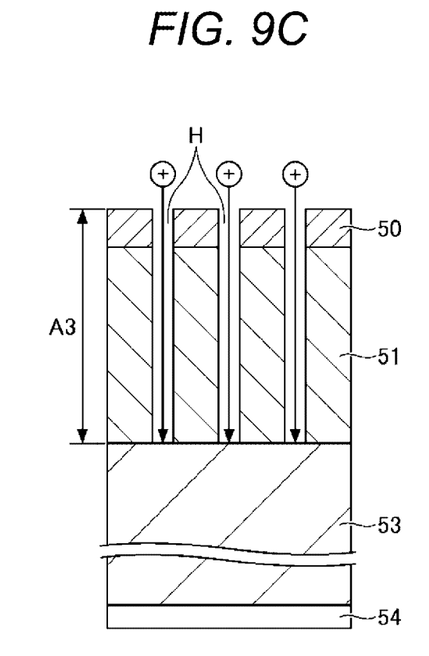

FIG. 9B illustrates the etching of the hole H at the etching depth A2 (>A1) where the aspect ratio is 3 or more (formation of the condensed layer or the like in step S71 and etching of S72). In the etching, the hole H becomes deeper, and thus, the condensation phenomenon or the solidification phenomenon occurs. By use of the phenomenon, the etchant of the $H_2O$ gas is efficiently supplied to the bottom of the etching shape, and the condensed layer or solidified layer 52 of the $H_2O$ is selectively formed at the bottom of the etching shape.

In step S72, when the flow rate of the $H_2O$ gas is excessively large, the adsorption amount of $H_2O$ to the bottom excessively increases, the surface of the etching shape of the carbon-containing film is completely covered with the $H_2O$, the ions in the plasma do not reach the carbon-containing film, resulting in decreasing the etching rate. Thus, controlling the $H_2O$ gas at a predetermined flow rate, and further controlling the temperature of the substrate support to 0° C. or less selectively form the condensed layer or solidified layer of $H_2O$ at the bottom of the etching shape due to the condensation phenomenon or the solidification phenomenon, thereby accelerating the etching.

In step S72 subsequent to step S71 illustrated in FIG. 8, the bias power is supplied to the substrate support 11, and ions in the thus generated plasma of the $H_2O$ gas is made to reach the bottom of the etching shape. Then, the condensed layer or solidified layer 52 of $H_2O$ is made to react with the carbon-containing film by the energy of the ions, thereby accelerating the etching of the carbon-containing film 51. In this way, as illustrated in FIG. 9B, anisotropic etching is performed on the carbon-containing film 51.

In particular, in step S72, the bias power is applied to the substrate support 11, thereby controlling the ions to reach the condensed layer or solidified layer 52. As a result, the etching is accelerated via the condensed or solidified layer 52 that functions as the etchant, so that the etching rate may be improved.

In step S9 illustrated in FIG. 8, it is determined whether the etching of the carbon-containing film 51 is completed. For example, as illustrated in FIG. 9C, it may be determined that the etching is completed at the point in time when the underlayer film 53 of the carbon-containing film 51 is exposed. The exposure of the base film 53 may be determined by using, for example, an end point detection technique. However, the method of determining whether the etching has been completed is not limited thereto.

When it is determined in step S9 that the etching of the carbon-containing film is not completed, the process returns to step S71, and steps S71 and S72 are repeated. During the repetition of step S71 and step S72, the temperature of the substrate support is adjusted to 0° C. or less. When it is determined in step S9 that the etching is completed, the method MT2 is ended.

In the method MT2 described above, step S71 of forming the condensed layer or solidified layer 52, and step S72 of performing the etching with plasma of the $H_2O$ gas are described as different steps. However, the steps may be executed at the same time. Steps S71 and S72 may be repeated. Without being limited to a case where steps S71 and S72 are repeatedly executed in turn, a case is also included such that a process that performs the etching with the plasma of the $H_2O$ gas is simultaneously carried out while the condensed layer or solidified layer 52 is being formed. The case simultaneously carried out improves etching throughput.

As a matter applicable to both the method MT1 and the method MT2 described above, the gas containing H and O used for the etching may contain a rare gas. Examples of the rare gas include argon gas and helium gas. In the etching, the rare gas contributes to the acceleration of the etching by the action of ions (for example, argon ions) in the plasma. That is, in the etching, the bias power is supplied to the substrate support 11, and the ions of the rare gas in the plasma are attracted to the bottom of the etching shape. As a result, the condensed or solidified layer 52 formed at the bottom of the etching shape reacts with the bottom of the etching shape by the energy of the ions, so that the etching is progressed. However, the ions that apply energy to the condensed or solidified layer 52 so as to contribute to the acceleration of the etching are not limited to the ions of the rare gas. Various ions in the plasma of the gas that includes the rare gas, H, and O can be attracted to the substrate W, thereby giving the energy to the condensed layer or solidified layer 52, so that the etching can be advanced. The gas used for the etching in step S7 and step S72 may contain a rare gas, and thus the plasma is stably generated. Further, the gas used for the etching in step S71 and step S72 may include a gas containing C, S, P, and Si as the gas for correcting the shape.

In step S71 of the method MT2, the gas containing H and O such as the $H_2O$ gas may be supplied to form the condensed layer or solidified layer 52, and in step S72, the gas type may be switched from the gas containing H and O to the rare gas, the etching may be performed by supplying the rare gas, and then step S71 and step S72 may be repeated. However, the rare gas may be included in the gas containing H and O, and step S71 and step S72 may be executed using the same gas type.

EXAMPLES

Examples of process conditions for each step in the methods MT1 and MT2 according to the embodiment will be described below.

Etching in Step S7 in FIG. 3

Target film: Carbon-containing film
HF power: 0.1 kW to 5 kW, 27 MHz to 100 MHz
LF power: 500 W or more, 200 kHz to 13.56 MHz
Gas: gas containing H and O (for example, $H_2O$ gas)
Temperature of the substrate support: 0° C. or less
Pressure in the space between the back surface of the substrate and the electrostatic chuck: 10 Torr to 200 Torr Etching in Step S7 in FIG. 8

Target film: Carbon-containing film (aspect ratio is less than 3)
HF power: 0.1 kW to 5 kW, 27 MHz to 100 MHz
LF power: 500 W or more, 200 kHz to 13.56 MHz
Gas: gas containing H and O (for example, $H_2O$ gas)
Temperature of the substrate support: 0° C. or less
Pressure in the space between the back surface of the substrate and the electrostatic chuck: 10 Torr to 200 Torr Etching in Steps S71 and S72 in FIG. 8

Target film: Carbon-containing film (aspect ratio is 3 or more) (Condensed layer forming step (S71 of FIG. 8) and etching step (S72 of FIG. 8))
HF power: 0.1 kW to 5 kW, 27 MHz to 100 MHz
LF power: 500 W or more, 200 kHz to 13.56 MHz
Gas: gas containing H and O (for example, $H_2O$ gas)
Temperature of the substrate support: 0° C. or less
Pressure in the space between the back surface of the substrate and the electrostatic chuck: 10 Torr to 200 Torr As described above, according to the etching method of the present embodiment, the etching may be accelerated.

Steps S7 and S19 of FIG. 8 may not be performed. For example, this includes: a case that prepares the substrate W in which a recessed portion of a first depth is formed in the carbon-containing film (step S1); a case that does not execute step S7 and step S19; the recessed portion of the first depth has already been formed in the substrate W; and/or forming the recessed portion of the first depth by etching. The recessed portion of the first depth indicates a depth at which the condensed layer and/or the solidified layer can be formed, and step S7 and step S19 can be omitted by providing of the substrate in which the recessed portion of the depth is formed.

Further, the disclosed embodiment further includes aspects of (A1) and (A2) below.

(A1) An etching method includes: (a) providing a substrate having a carbon-containing film, wherein a recessed portion of a first depth defined by a bottom and a side wall is formed in the carbon-containing film; (b) supplying a gas containing H and O to selectively form a condensed layer or solidified layer of $H_2O$ at the bottom; and (c) etching the bottom with plasma by supplying a bias power to the substrate support to form a recessed portion of a second depth deeper than the first depth, wherein in (b) and (c), a temperature of the substrate support is adjusted to 0° C. or less.

(A2) An etching method includes: (a) providing a carbon-containing film and a substrate having a mask on the carbon-containing film, wherein a recessed portion of a first depth defined by a bottom and a sidewall is formed in the carbon-containing film; (b) supplying a gas containing H and O to selectively form a condensed layer or solidified layer of $H_2O$ at the bottom; and (c) etching the bottom with plasma by supplying a bias power to the substrate support to form a recessed portion of a second depth deeper than the first depth, wherein in (b) and (c), a temperature of the substrate support is adjusted to 0° C. or less.

(A3) the etching method according to (A2), wherein an aspect ratio calculated by combining the recessed portion and the mask of the substrate provided in the providing step is 3 or more.

(A4) the etching method according to any one of (A1) to (A3), wherein in the step of forming the condensed layer or solidified layer, plasma is formed from $H_2O$.

For the recessed portion of the first depth, the aspect ratio indicated by A1 in FIG. 9A is smaller than a predetermined value, and as an example, the aspect ratio is smaller than 3. For the recessed portion of the second depth, the aspect ratio indicated by A2 in FIG. 9B is a predetermined value or more, and as an example, the aspect ratio is 3 or more. The recessed portion of the second depth may have an aspect ratio of a predetermined value or more and an opening diameter of a predetermined value or less. For example, the recessed portion of the second depth may have the aspect ratio of 3 or more and the opening diameter of 200 nm or less.

While certain embodiments have been described using the etching method and the plasma processing apparatus, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

According to one aspect, an etchant is efficiently supplied to a bottom of an etching shape formed on a substrate having a carbon-containing film, and thus the etching rate can be increased.

The invention claimed is:

1. An etching method comprising:
providing a substrate including a carbon-containing film on a substrate support;
etching the substrate with a plasma to form an etching shape in the carbon-containing film, the plasma being formed from $H_2O$ gas, and the etching shape including a bottom;
adjusting a temperature of the substrate support to 0° C. or less, wherein the adjusting includes controlling a magnitude of bias power supplied to the substrate support; and
adjusting a flow rate of the $H_2O$ gas, which results in selectively forming a condensed layer of a liquid-phase or a solidified layer of a solid-phase at the bottom of the etching shape.

2. The etching method according to claim 1, wherein the adjusting of the temperature includes, after the providing of the substrate, adjusting the temperature of the substrate support to −30° C. or less.

3. The etching method according to claim 1, further comprising:
supplying a bias voltage to the substrate support and etching the bottom with the formed plasma,
wherein in the etching of the substrate and the supplying of the bias voltage, the temperature of the substrate support is adjusted to 0° C. or less.

4. The etching method according to claim 3, wherein the bias voltage is pulsed.

5. The etching method according to claim 3, wherein the bias voltage is a negative direct-current bias.

6. An etching method comprising:
providing a substrate including a carbon-containing film on a substrate support;
etching the substrate with a plasma to form an etching shape in the carbon-containing film, the plasma being formed from a gas containing H and O, and the etching shape including a bottom;
adjusting a temperature of the substrate support to 0° C. or less, wherein the adjusting includes controlling a magnitude of bias power supplied to the substrate support; and
adjusting a flow rate of the gas containing H and O, which results in selectively forming a condensed layer of a liquid-phase, or a solidified layer of a solid-phase, of $H_2O$ at the bottom of the etching shape, by the plasma formed from the containing H and O.

7. The etching method according to claim 6, wherein the etching of the substrate to form the etching shape is performed simultaneously with the selective formation.

8. The etching method according to claim 6, wherein the selective formation is performed upon occurrence of a condition in which an opening diameter of the etching shape is 200 nm or less and an aspect ratio is 3 or more.

9. The etching method according to claim 6, further comprising:
attracting an ion in the plasma to the bottom such that the condensed layer or solidified layer formed at the bottom reacts with the bottom, to thereby progress the etching.

* * * * *